United States Patent
Huang et al.

(10) Patent No.: US 10,008,367 B2
(45) Date of Patent: Jun. 26, 2018

(54) GAS DIFFUSER UNIT, PROCESS CHAMBER AND WAFER PROCESSING METHOD

(71) Applicant: TAIWAN SEMICONDUCTOR MANUFACTURING COMPANY, LTD., Hsinchu (TW)

(72) Inventors: Chien Kuo Huang, Hsinchu (TW);
Shih-Wen Huang, Tainan (TW);
Joung-Wei Liou, Zhudong Town (TW);
Chia-I Shen, Hsinchu (TW); Fei-Fan Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 890 days.

(21) Appl. No.: 13/927,631

(22) Filed: Jun. 26, 2013

(65) Prior Publication Data
US 2015/0002017 A1    Jan. 1, 2015

(51) Int. Cl.
| C23C 16/52 | (2006.01) |
| H01J 37/32 | (2006.01) |
| H01L 21/67 | (2006.01) |
| C23C 16/452 | (2006.01) |
| C23C 16/455 | (2006.01) |

(52) U.S. Cl.
CPC ...... *H01J 37/32449* (2013.01); *C23C 16/452* (2013.01); *C23C 16/45565* (2013.01); *C23C 16/52* (2013.01); *H01J 37/3244* (2013.01); *H01L 21/6708* (2013.01); *H01L 21/67051* (2013.01)

(58) Field of Classification Search
CPC . H01J 37/32449; H01J 37/3244; C23C 16/52; C23C 16/45565; C23C 16/452; H01L 21/67051; H01L 21/6708
USPC ....... 156/345.43, 345.44, 345.33; 118/723 E, 118/723 R
See application file for complete search history.

(56) References Cited

U.S. PATENT DOCUMENTS

| 7,837,825 B2 * | 11/2010 | Fischer | H01J 37/32623 118/723 E |
| 2003/0084848 A1 * | 5/2003 | Long | 118/715 |
| 2005/0000441 A1 * | 1/2005 | Kaeppeler | C23C 16/45568 118/723 E |
| 2009/0061111 A1 * | 3/2009 | Mishima et al. | 427/589 |

\* cited by examiner

*Primary Examiner* — Rudy Zervigon
(74) *Attorney, Agent, or Firm* — Hauptman Ham, LLP

(57) ABSTRACT

A gas diffuser unit for a process chamber includes at least one controllable diffuser, a power source, and a controller. The at least one controllable diffuser is configured to generate controllable forces acting in various directions on a gaseous material in a flow of the gaseous material introduced into the process chamber, to spread the gaseous material inside the process chamber. The power source is coupled to the at least one controllable diffuser, and configured to supply power to the at least one controllable diffuser to generate the controllable forces. The controller is coupled to the power source and configured to control the power supplied by the power source to the at least one controllable diffuser.

12 Claims, 11 Drawing Sheets

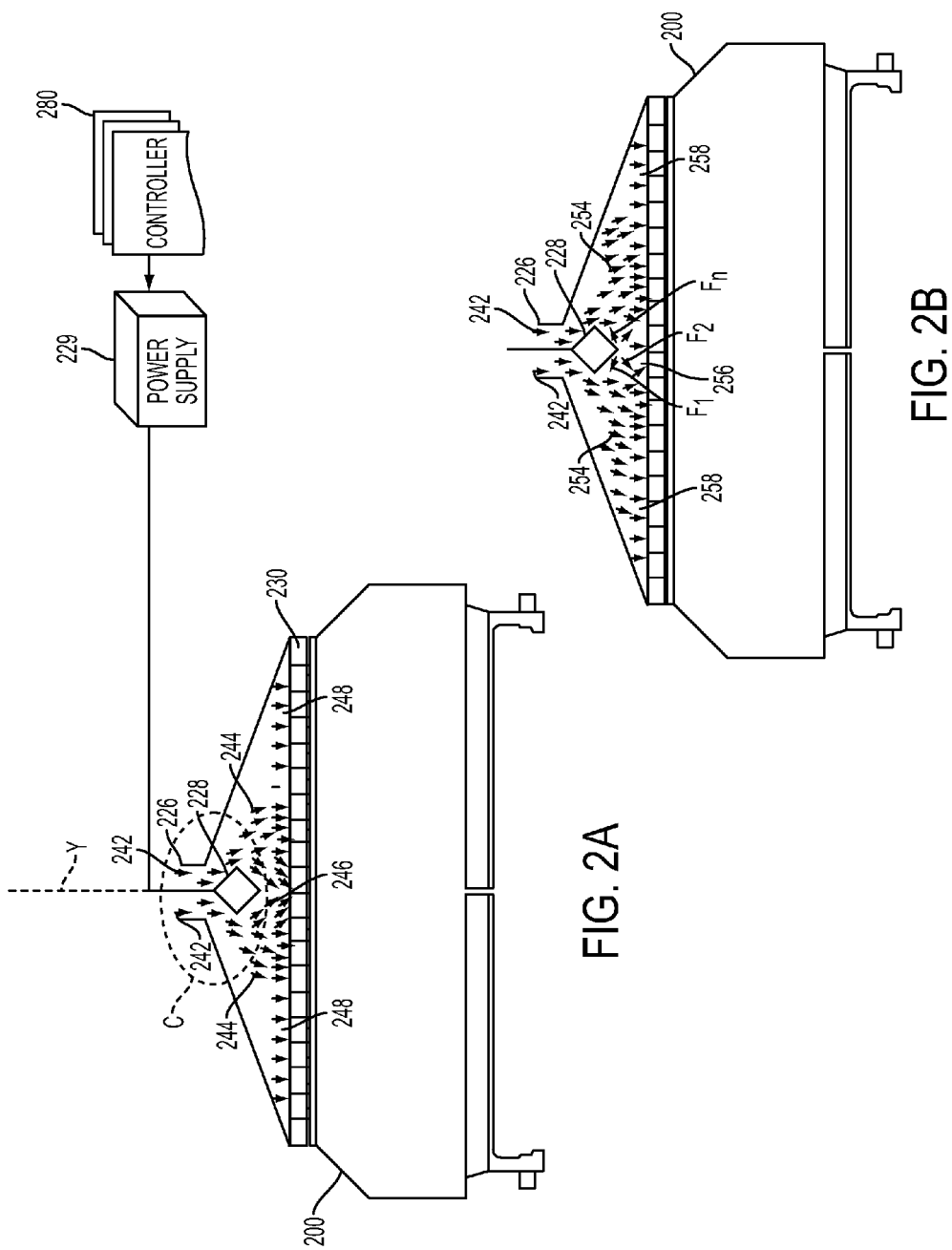

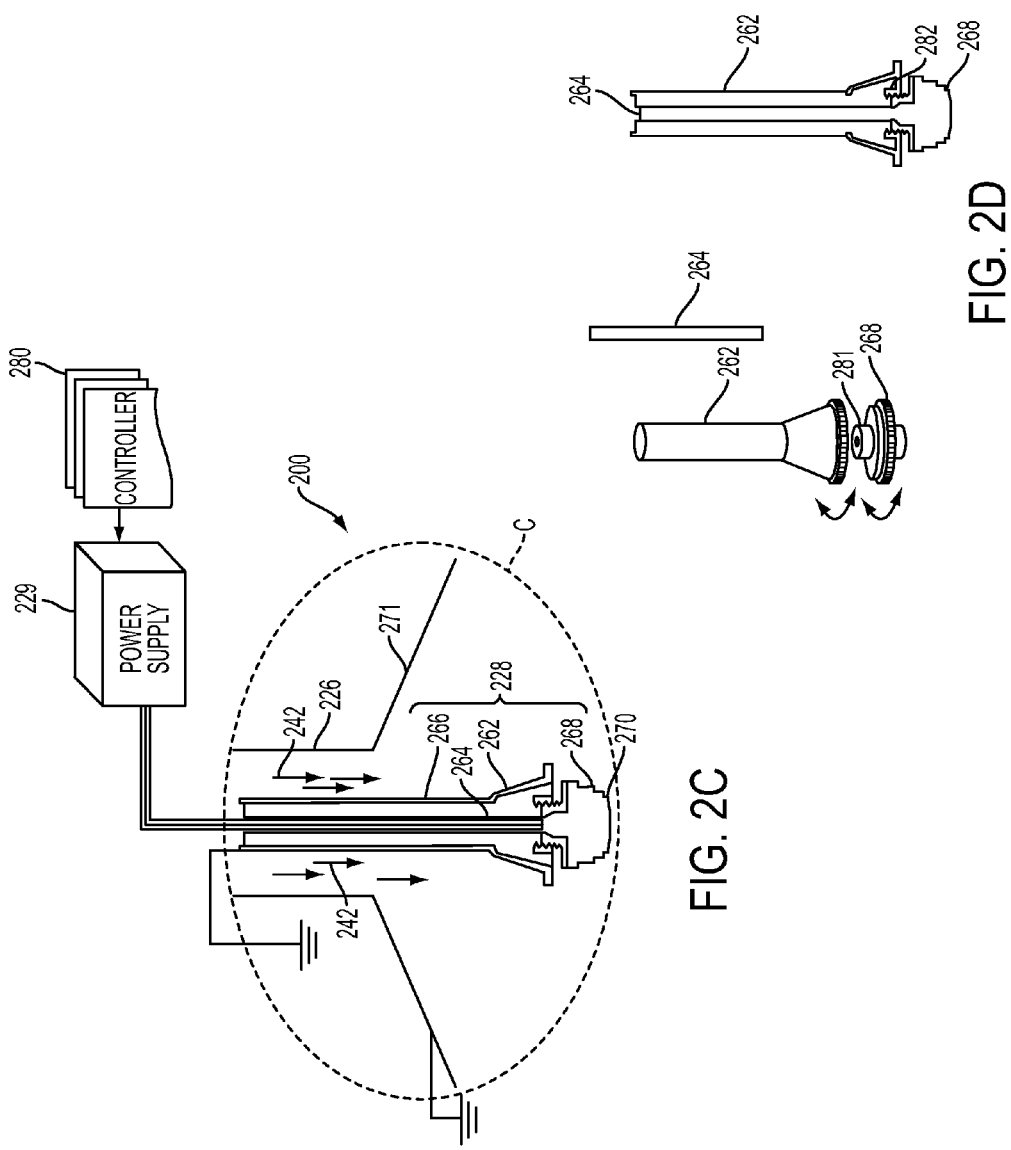

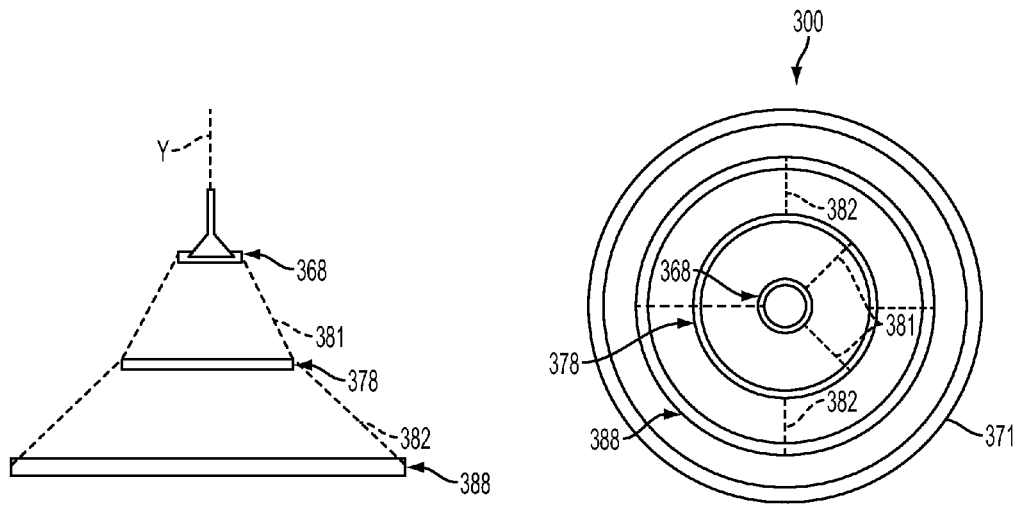
FIG. 3B
FIG. 3C
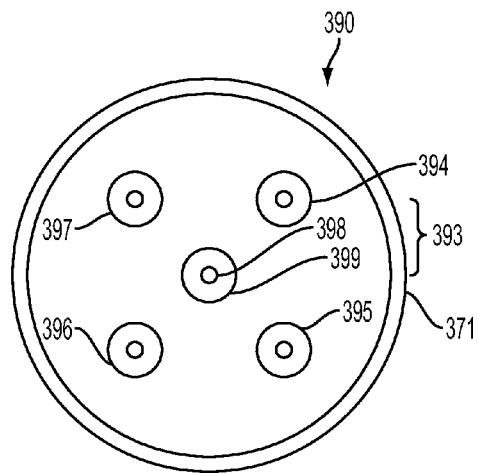
FIG. 3D

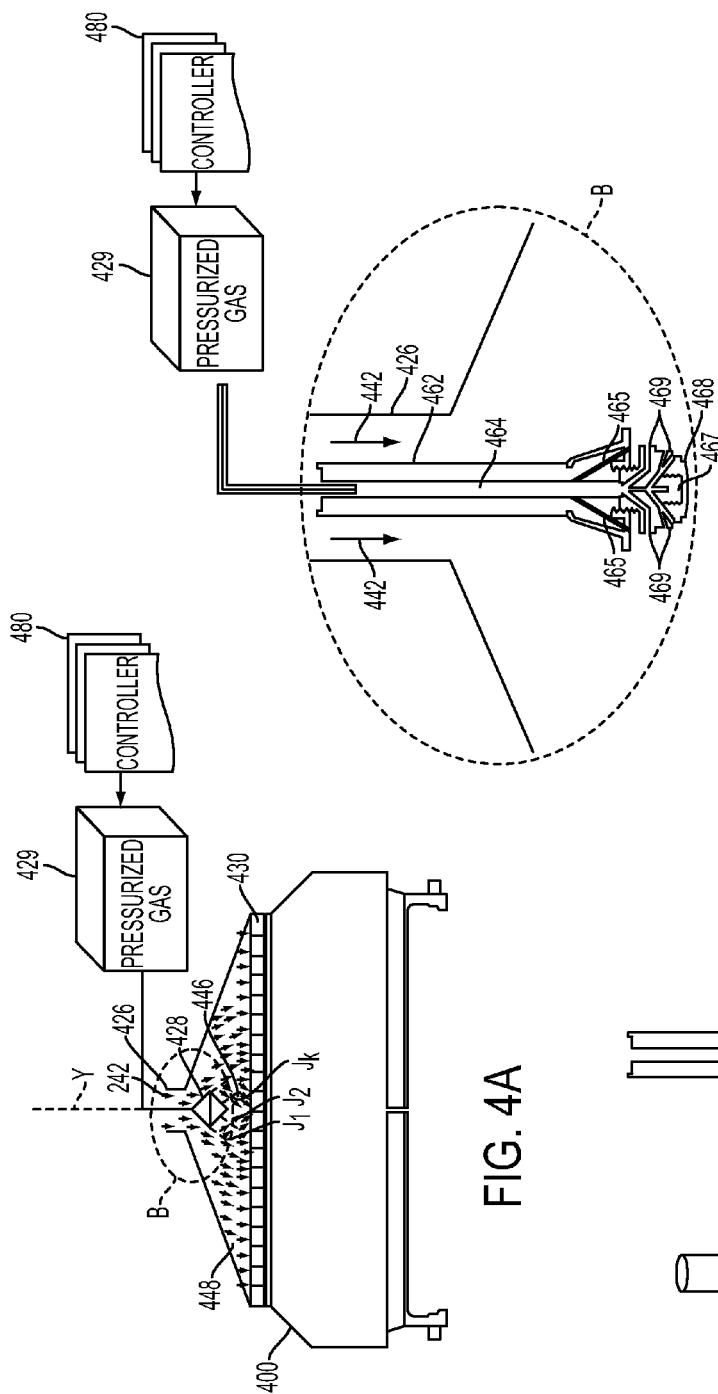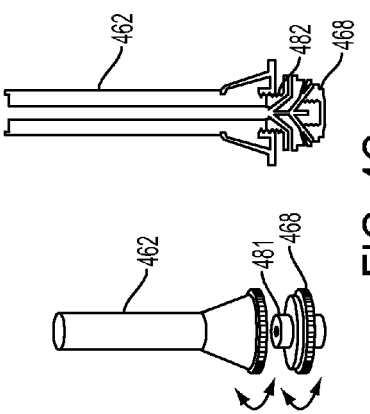

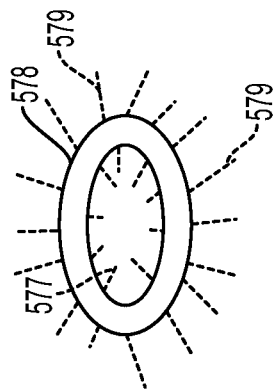
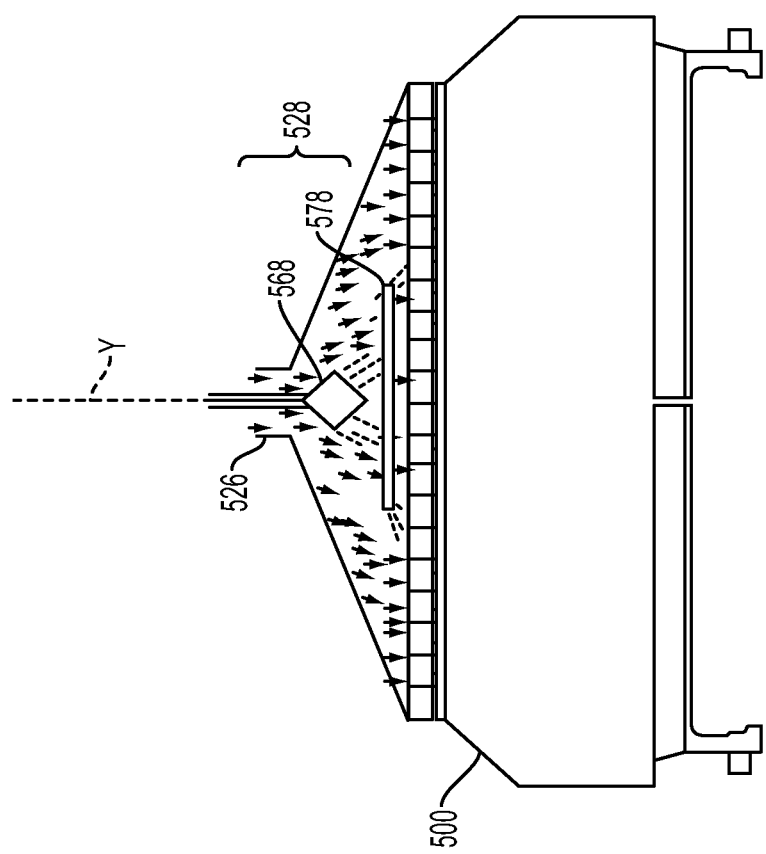

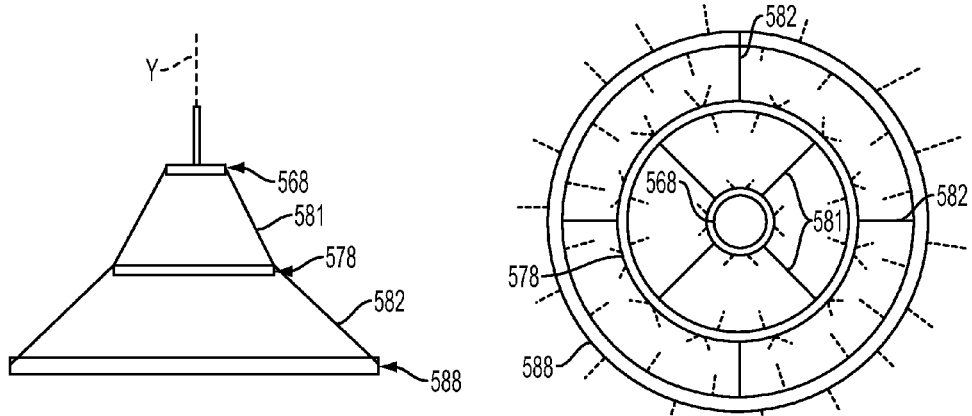
FIG. 5C
FIG. 5D
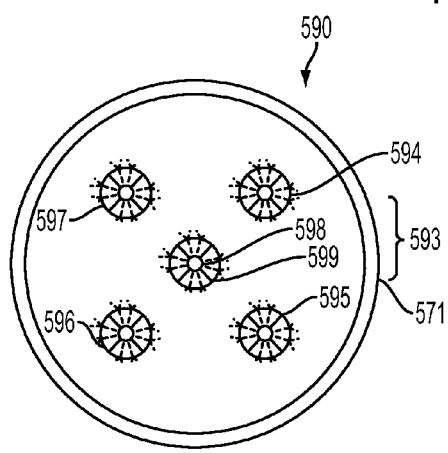
FIG. 5E

GAS DIFFUSER UNIT, PROCESS CHAMBER AND WAFER PROCESSING METHOD

BACKGROUND

A recent tendency in the field of semiconductor manufacturing is to reduce production cost by using larger wafers. The migration to a larger wafer size, while rewarding in an increased number of chips per wafer, also poses numerous technical challenges, such as maintenance of a uniform processing environment across a large wafer. A consideration for ensuring uniformity of the processing environment across a wafer includes uniformity of the distribution of process gas supplied to process the wafer.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 2A-2B are schematic side views of a process chamber with a diffuser, in accordance with some embodiments.

FIG. 2C is an enlarged schematic view of a portion of the diffuser in FIG. 2A, in accordance with some embodiments.

FIG. 2D includes schematic views of a diffuser in disassembled and assembled states, in accordance with some embodiments.

FIG. 3B is an enlarged schematic side view of the multi-zone diffuser in FIG. 3A, in accordance with some embodiments.

FIG. 3C is a schematic top view of the multi-zone diffuser in FIG. 3B, in accordance with some embodiments.

FIG. 3D is a schematic top view of a multi-zone diffuser, in accordance with some embodiments.

FIG. 4A is a schematic side view of a process chamber with a diffuser, in accordance with some embodiments.

FIG. 4B is an enlarged schematic view of a portion of the diffuser in FIG. 4A, in accordance with some embodiments.

FIG. 4C includes schematic views of a diffuser in disassembled and assembled states, in accordance with some embodiments.

FIG. 5A is a schematic side view of a process chamber with a multi-zone diffuser, in accordance with some embodiments.

FIG. 5B is an enlarged schematic, perspective view of a diffusing member in the multi-zone diffuser of FIG. 5A, in accordance with some embodiments.

FIG. 5C is an enlarged schematic side view of the diffuser in FIG. 5A, in accordance with some embodiments.

FIG. 5D is a schematic top view of the multi-zone diffuser in FIG. 5C, in accordance with some embodiments.

FIG. 5E is a schematic top view of a multi-zone diffuser, in accordance with some embodiments.

DETAILED DESCRIPTION

Figure 1A:
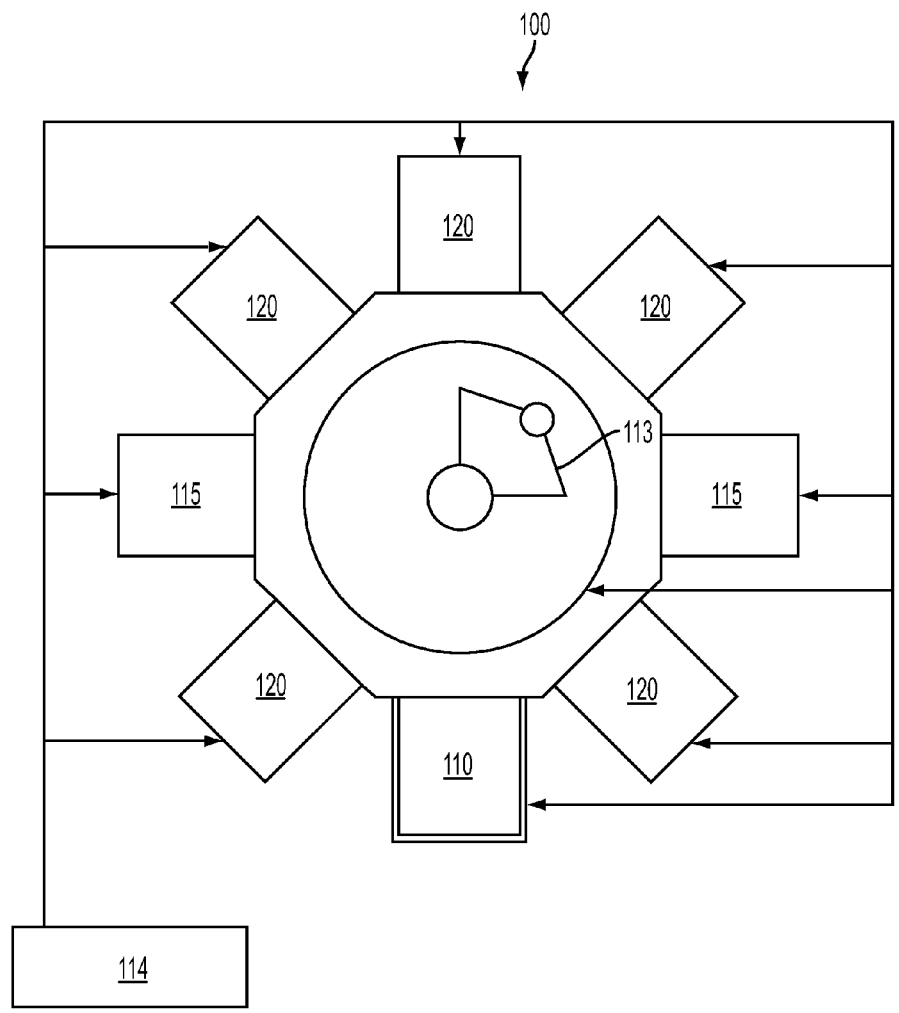
FIG. 1A is a schematic view of a wafer processing system, in accordance with some embodiments.

It is to be understood that the following disclosure provides many different embodiments or examples, for implementing different features of various embodiments. Specific examples of components and arrangements are described below to simplify the present disclosure. An inventive concept may, however, be embodied in many different forms and should not be construed as being limited to the embodiments set forth herein; rather, these embodiments are provided so that this description will be thorough and complete, and will fully convey an inventive concept to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of an inventive concept.

Some embodiments provide a controllable diffuser configured to generate controllable forces acting in various directions on a gaseous material in a flow of the gaseous material introduced into a process chamber. Examples of such controllable forces include, but are not limited to, electrostatic forces acting on ions included in the gaseous material, or forces caused by impact of jets of pressurized gas with atoms, ions and/or molecules in the gaseous material. The controllable forces spread the gaseous material inside the process chamber. As a result, uniformity of the distribution of the gaseous material supplied to process a wafer in the process chamber is improved, which, in turn, improves uniformity of one or more processed films or layers on the wafer as well as yield and quality of wafer processing. Compared to other approaches where passive deflecting surfaces are used to spread gaseous materials, the controllable diffuser in accordance with some embodiments provides greater flexibility and/or precision in controlling the distribution of the gaseous materials. In the description herein, "controllable diffuser" and "diffuser" are interchangeably used, unless otherwise specified.

FIG. 1A is a schematic view of a wafer processing system 100 in accordance with some embodiments. The wafer processing system 100 in FIG. 1 includes a load lock chamber 110, a robot 113, a controller 114, one or more metrology chambers 115, and a plurality of process chambers 120. The load lock chamber 110 transfers wafers into and out of the wafer processing system 100, e.g., under a vacuum environment. The robot 113 transfers the wafer among the load lock chamber 110, the process chambers 120, and the metrology chambers 115. The process chambers 120 are equipped to perform one or more of numerous processes or treatments, such as plasma processes, Chemical Vapor Deposition (CVD), Atomic Layer Deposition (ALD), Physical Vapor Deposition (PVD), annealing, etching, degassing, pre-cleaning, cleaning, post-cleaning, etc. The metrology chambers 115 are configured to measure various properties of wafers before or after processing. In some embodiments, one or more metrology chambers 115 is/are integrated in one or more of the process chambers 120. The controller 114 is configured to control wafer measurement, transfer and processing. In one or more embodiments, the controller 114 comprises a hardware platform, such as a processor or controller chip coupled with a memory, which is programmable by software and/or firmware to perform the functions described herein. In some embodiments, the controller 114 comprises a dedicated hardware circuit, e.g., in the form of an application-specific integrated circuit (ASIC) hardwired to perform one or more of the processes described herein. While five process chambers 120 and two metrology chambers 115 are shown, other numbers of process chambers 120 and/or metrology chambers 115 are within the scope of this disclosure. Likewise, in some embodiments, more than one robot 113 and/or load lock chamber 110 are included in the processing system 100.

Figure 1B:
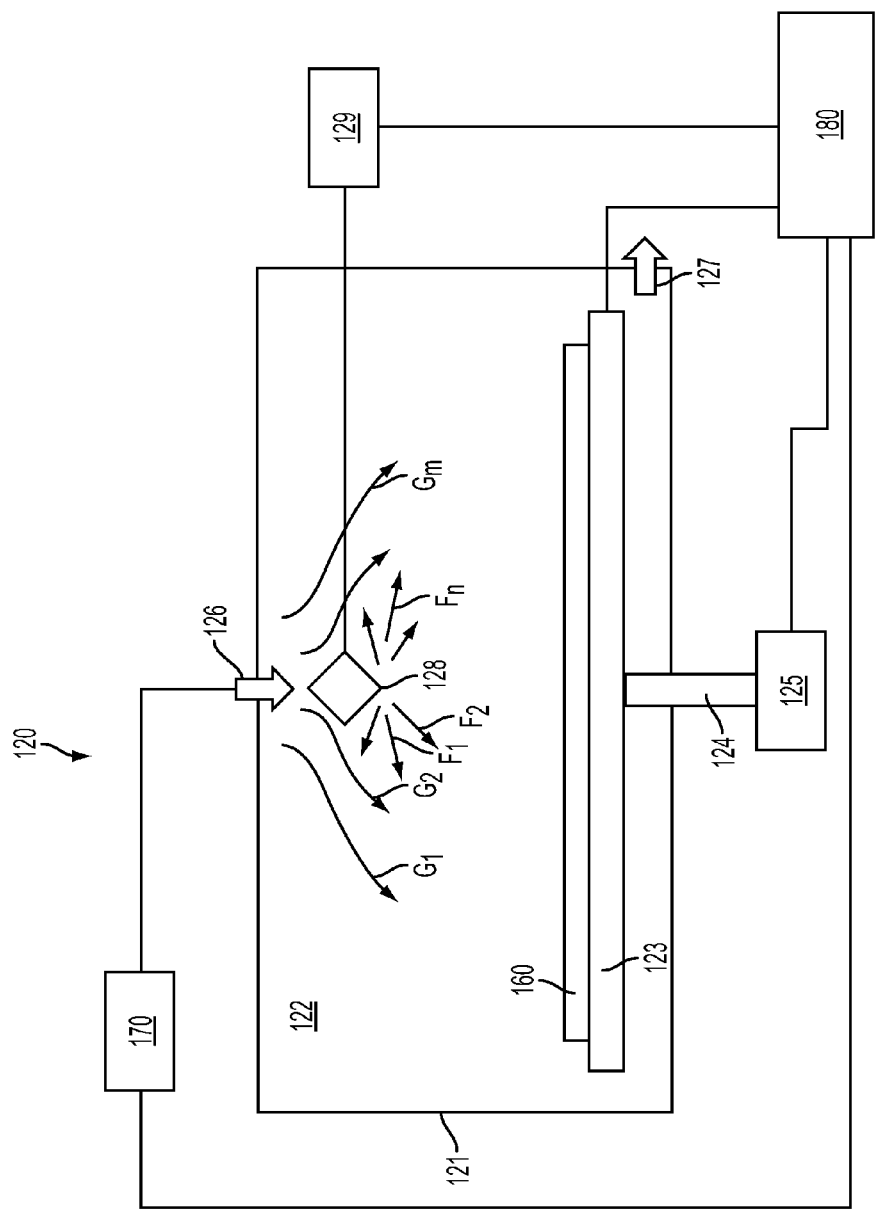
FIG. 1B is a schematic cross-section view of a process chamber, in accordance with some embodiments.

FIG. 1B is a schematic cross-section view of the process chamber 120 in accordance with some embodiments. The process chamber 120 includes a housing 121 defining an interior 122, a wafer support 123 in the interior 122, a shaft 124 and a motor 125 for supporting and driving the wafer support 123, a gas inlet 126, a gas outlet 127, and a diffuser 128. The wafer support 123 is arranged in the housing 121, and is configured to support thereon a wafer 160 to be processed. In some embodiments, the wafer support 123 is an electrostatic chuck (ESC), a vacuum chuck or a mechanical chuck configured to secure the wafer 160 thereon. In some embodiments, the wafer support 123 includes one or more heaters (e.g., resistive heating elements) for heating the wafer 160 during wafer processing. In some embodiments, the wafer support 123 is a rotary or rotatable chuck that is supported on a shaft 124 for rotational movement as the shaft 124 is driven by a motor 125.

At least one gas inlet 126 is provided through the housing 121 for supplying flow of a gaseous material from a gaseous material delivery unit 170 into the process chamber 120. One or more gas outlets 127 are provided through the housing 121 for exhausting the worked and/or contaminated gaseous material from the process chamber 120. In some embodiments, a vacuum system is connected to one or more of the gas outlets 127 for maintaining an intended operating pressure in the process chamber 120.

The gaseous material is supplied to perform a processing on the wafer 160 in the process chamber 120. Examples of processing include, but are not limited to, film deposition, ion implantation, etching and cleaning. In at least one embodiment, the gaseous material includes a vapor of at least one material which is normally in a liquid or solid state. Alternatively or additionally, the gaseous material includes at least one material which is normally in the gaseous state. In at least one embodiment, the gaseous material includes ions generated, for example, by a plasma for a plasma process to be performed in the process chamber 120. Examples of plasmas processes include, but are not limited to, plasma enhanced film deposition, plasma etch and plasma photoresist strip (PR strip). Examples of plasmas enhanced film deposition include, but are not limited to, plasma enhanced chemical vapor deposition (PECVD) and plasma enhanced atomic layer deposition (PEALD). To generate ions included in the gaseous material, a plasma power source, e.g., one or more spiral coils, is provided inside or outside the process chamber 120. In at least one embodiment where the plasma power source is provided outside the process chamber 120, the generated ions are included in the flow of gaseous material entering the process chamber 120 via the gas inlet 126. In at least one embodiment where the plasma power source is provided inside the process chamber 120, the flow of gaseous material entering the process chamber 120 via the gas inlet 126 does not include ions, and the plasma power source is provided downstream of the gas inlet 126 to generate ions inside the process chamber 120. In at least one embodiment, the processing to be performed in the process chamber 120 does not involve a plasma, and the gaseous material no ions both outside and inside the process chamber 120. Other arrangements are within the scope of various embodiments.

The diffuser 128 is provided in the process chamber 120, between the gas inlet 126 and the wafer support 123 for spreading the gaseous material in various directions, before the gaseous material contacts the wafer 160 supported on the wafer support 123 and performs the intended processing. By spreading the gaseous material in various directions inside the process chamber 120, the distribution of the gaseous material becomes more uniform across the wafer 160, resulting in a more uniform processing of the wafer 160, than situations where no diffuser is used. The diffuser 128 in accordance with some embodiments is configured to generate controllable forces acting in various directions on the gaseous material to spread the gaseous material inside the process chamber 120. For example, the diffuser 128 generates forces F1, F2, . . . Fn oriented in various directions as exemplarily illustrated in FIG. 1B. The orientations of the forces F1, F2, . . . Fn in FIG. 1B are for illustrative purposes only. The forces F1, F2, . . . Fn are controllable in magnitude and/or direction. The forces F1, F2 . . . Fn act on molecules, atoms and/or ions in the gaseous material, and deflect traveling paths of the gaseous material in various directions as exemplarily illustrated by arrows G1, G2, . . . Gm in FIG. 1B. As a result, the gaseous material is spread or dispersed inside the process chamber 120, in a distribution that is more uniform across the wafer 160 than in the flow of gaseous material at the gas inlet 126. Compared to other approaches where passive deflecting surfaces are used to spread gaseous material and, hence, forces for spreading such gaseous material are dependent significantly on the flow of the gaseous material impinging on the deflecting surfaces, the forces F1, F2 . . . Fn generated by the diffuser 128 in accordance with some embodiments are controllable independently of the flow of the gaseous material, thereby providing greater flexibility and/or precision in controlling the distribution of the gaseous material in the process chamber 120. In addition, for large wafers, such as 450 mm wafers, it is more difficult for the other approaches using passive deflecting surfaces to obtain a uniform gaseous material distribution across the large wafer. In contrast, the diffuser 128 in accordance with some embodiments permits the forces F1, F2 . . . Fn to be controlled in magnitude and/or direction, such that a uniform gaseous material distribution across the large wafer is obtainable.

A power source 129 is coupled to the diffuser 128 to supply power to the diffuser 128 to generate the controllable forces F1, F2 . . . Fn. A controller 180 is coupled to the power source 129 to control the power supplied by the power source 129 to the diffuser 128. In at least one embodiment, the controller 180 controls one or more parameters of the power supplied by the power source 129. For example, when the power supplied by the power source 129 is electric power as described herein with respect to FIGS. 2A-3D, the controller 180 controls at least one of current, voltage, or polarity of the electric power. In another example, when the power supplied by the power source 129 is pressurized gas as described herein with respect to FIGS. 4A-5E, the controller 180 controls at least one of pressure, flow rate or material of the pressurized gas. As the power supplied by the power source 129 to the diffuser 128 varies under control of the controller 180, the forces F1, F2 . . . Fn are variable in magnitude and/or direction, to vary the distribution of the gaseous material in the process chamber 120.

In some embodiments, power parameters of the power to be controlled by the controller 180, as well as flow parameters of the flow of gaseous material to be introduced into the process chamber 120 via the gas inlet 126, are maintained as pre-stored data, e.g., in the form of a look-up table (LUT), in a data storage accessible by the controller 180. Examples of the flow parameters include, but are not limited to, pressure, flow rate or material of the gaseous material. Examples of a data storage include, but are not limited to, an optical disk (such as a DVD), a magnetic disk (such as a hard disk), and a semiconductor memory (such as a ROM, a RAM, a memory card), and the like. In some embodiments, the data storage is incorporated, partly or wholly, in the controller 180. The pre-store data is collected from a number of previously performed processes, and correlate each set of flow parameters with a corresponding set of power parameters that had resulted in a successful processing, for example, a uniform thickness of a processed layer on a wafer.

When the pre-stored data includes a set of flow parameters matching the parameters of a flow of gaseous material to be introduced into the process chamber 120 for processing a wafer, the controller 180 controls the power supplied to the diffuser 128 based on the corresponding set of power parameters that had resulted in a successful processing. If no matching is found in the pre-stored data, the controller 180 calculates the power parameters, e.g., by interpolation, based on the pre-stored data, and uses the calculated power parameters to control the controllable forces F1, F2 . . . Fn generated by the diffuser 128. In at least one embodiment, the calculated power parameters are stored in the data storage for subsequent use on other wafers and/or wafer batches. In some embodiments, pre-stored data is replaced or used in conjunction with one or more formulas and/or computer simulations to determine the power parameters to be used by the controller 180 to control the forces F1, F2 . . . Fn generated by the diffuser 128.

In at least one embodiment, the power parameters calculated or read out from the data storage are used by the controller 180 to control the diffusion operation of the diffuser 128 for processing a first wafer in a wafer batch. The quality of the processing is then evaluated. For example, uniformity of a thickness of a processed layer on the first wafer is evaluated in a metrology chamber 115. If the thickness uniformity of the processed layer meets a predetermined standard, the power parameters used for the first wafer are used for diffusing the gaseous material when processing a subsequent wafer in the batch, and are stored (if not already stored) in the pre-stored data. If the thickness uniformity of the processed layer does not meets a predetermined standard, at least one of the power parameters used for the first wafer is adjusted by the controller 180. For example, if a thickness measurement at the metrology chamber 115 indicates that the processed layer has a higher thickness at the center of the wafer than at the edge of the wafer, indicating that the gaseous material was concentrated more at the center than at the edge, the controller 180 controls the power supplied to the diffuser 128 such that one or more of the forces F1, F2 . . . Fn increase at the center of the wafer so as disperse more gaseous material from the center of the wafer toward the edge. The adjusted power parameters are then used for diffusing the gaseous material when processing a subsequent wafer in the batch, and are stored in the pre-stored data. In at least one embodiment, the valuation of the processing quality and the adjustment of the power parameters are repeated one or more times until the processing quality meets a predetermined standard.

In some embodiments, in addition to controlling the power supplied from the power source 129 to the diffuser 128, the controller 180 is further connected to one or more of the wafer support 123 for controlling a heating of the wafer 160 on the wafer support 123, a plasma source for controlling plasma power in a plasma processes, the gaseous material delivery unit 170 for controlling the flow of the gaseous material supplied to the gas inlet 126, the shaft 124 for controlling a height of the wafer support 123 in the process chamber 120, and the motor 125 for controlling a rotation of the wafer support 123. In some embodiments, the controller 180 is incorporated, partly or wholly, in the controller 114 of the wafer processing system 100.

FIG. 2A is schematic side view of a process chamber 200, in accordance with some embodiments. The process chamber 200 has a gas inlet 226, a diffuser 228, and a membrane 230. The diffuser 228 includes at least one electrode electrically coupled to an electric power supply 229 which, in turn, is coupled to a controller 280. In at least one embodiment, the process chamber 200, the gas inlet 226, the diffuser 228, the electric power supply 229 and the controller 280 correspond to the process chamber 120, the gas inlet 126, the diffuser 128, the power source 129 and the controller 180 described herein with respect to FIG. 1B.

The membrane 230 is disposed between the diffuser 228 and a wafer support corresponding to the wafer support 123 described herein with respect to FIG. 1B. The membrane 230 includes a plurality of openings allowing the gaseous material dispersed by the diffuser 228 to pass through to a wafer supported on the wafer support. The membrane 230 functions, in at least one embodiment, to further distribute the dispersed gaseous material uniformly across the wafer and/or to reduce the impact of the dispersed gaseous material with the wafer. In some embodiments, the membrane 230 is omitted.

The diffuser 228, the electric power supply 229 and the controller 280 together define a gas diffuser unit. The diffuser 228 includes at least one electrode. The electric power supply 229 is electrically coupled to the electrode of the diffuser 228. The controller 280 is configured to control electric power supplied by the electric power supply 229 to the electrode of the diffuser 228. In at least one embodiment, the electric power supply 229 is a DC power supply that supplies DC power to the electrode of the diffuser 228 to create an electric field around the electrode of the diffuser 228. The generated electric field interacts, via electrostatic attraction or repulsion, with ions included in the flow of gaseous material introduced through the gas inlet 226 from a plasma source outside the process chamber 200. The interaction with the electric field changes the traveling paths of the ions and disperses the ions inside the process chamber 200. The stronger the electric field, the more widely the ions are dispersed inside the process chamber 200. By varying at least one of current, voltage or polarity o the electric power supplied to the diffuser 228 from the electric power supply 229 under control of the controller 280, the polarity, shape and/or magnitude of the electric field are variable, resulting in different interaction forces between the electric field and the ions and, hence, resulting in different distributions of the ions across the wafer. In at least one embodiment, a uniform distribution of the ions inside the process chamber 200 is achievable under control of the controller 280, for example as described with respect to the controller 180 in FIG. 1B.

In a specific example as illustrated in FIG. 2A, when electric power of a low positive voltage is supplied to the electrode of the diffuser 228, a relatively weak electric field is generated around the electrode of the diffuser 228. Positive ions (e.g., $NH_x^+$) in the flow of the gaseous material introduced through the gas inlet 226 travel generally along an axis Y of the gas inlet 226, as illustrated at arrows 242. The electric field weakly interacts with, i.e., repulses, the positive ions in the flow of the gaseous material introduced through the gas inlet 226, and deflects the ions away from the axis Y, as illustrated at arrows 244. The interaction forces acting on the ions are insufficient to deflect a significant portion of the ions, and as a result, a distribution of the ions in a central region 246 inside the process chamber 200, behind the diffuser 228 and in a vicinity of the axis Y, is still significantly higher than in peripheral regions 248. With such a non-uniform distribution of the gaseous material, a non-uniform processing is likely to occur on the wafer being processed.

FIG. 2B is schematic side view of the process chamber 200, illustrating a situation when electric power of a higher positive voltage than in FIG. 2A is supplied to the electrode of the diffuser 228. The higher position voltage causes the electrode of the diffuser 228 to generate a stronger electric field. The stronger electric field interacts with the positive ions in the flow of the gaseous material with stronger repulsive forces as illustrated at F1, F2 . . . Fn, and deflects the ions farther away from the axis Y, as illustrated at arrows 254. As a result, a distribution of the ions in a central region 256 inside the process chamber 200, behind the diffuser 228 and in a vicinity of the axis Y, becomes similar to peripheral regions 258. With such a more uniform distribution of the gaseous material, a more uniform processing is likely to occur on the wafer being processed. When the ions included in the flow of the gaseous material are negative ions, the controller 280 controls the electric power supply 229 to reverse the polarity of the electric power supplied to the electrode of the diffuser 228.

FIG. 2C is an enlarged schematic view of a portion in a circle C of the diffuser 228 in FIG. 2A, in accordance with some embodiments. The diffuser 228 includes a tubular part 262, a conductor 264, an insulating material 266 between the tubular part 262 and the conductor 264, and an electrode 268 for generating interaction forces acting on ions in the flow of the gaseous material. In some embodiments, the tubular part 262 includes a conductive material, such as aluminum. The tubular part 262 extends through the gas inlet 226 such that the gaseous material introduced into the process chamber 200 flows around the tubular part 262, as illustrated by arrows 242. In some embodiments, the electrode 268 includes a conductive material, such as aluminum. The conductor 264 has a first end (e.g., upper end) electrically coupled to the electric power supply 229, and a second end (e.g., lower end) electrically coupled to the electrode 268 to provide electric power from the electric power supply 229 to the electrode 268. To prevent ions in the gaseous material flowing through the tubular part gas inlet 226 and around the tubular part 262 from being affected too early by the electric power transmitted via the conductor 264, the insulating material 266, such as ceramic or sapphire, is provided between the tubular part 262 and the conductor 264. Alternatively or additionally, the tubular part 262 is grounded as illustrated in FIG. 2C. In some embodiments, the tubular part 262 is formed of a non-conductive material. In at least one embodiment when the tubular part 262 is formed of a non-conductive material, the insulating material 266 is omitted. Other arrangements for supplying electric power to the electrode 268 without going through the gas inlet 226 are within the scope of various embodiments.

The electrode 268 is physically attached to a lower end of the tubular part 262 as described herein with respect to FIG. 2D, and is electrically coupled with the conductor 264 to receive the supplied electric power. The electrode 268 defines a force generating part configured to generate electrostatic forces acting in various directions on ions included in the gaseous material introduced through the gas inlet 226. In one or more embodiments, a chamber wall 271 of the process chamber 200 adjacent the electrode 268 is conductive and grounded to assist in the generation of a steady electric field between the electrode 268 and the chamber wall 271. Voltages other than the ground voltage are applicable to the chamber wall 271 and/or the tubular part 262 in various embodiments.

In at least one embodiment, the metal or conductive material of the electrode 268 is potentially reactive with the gaseous material. To prevent such a potential reaction, an outer surface of the electrode 268 is coated with a coating 270 made of, e.g., ceramic or sapphire. Similarly, in one or more embodiments, an outer surface of the tubular part 262 configured to come into contact with the gaseous material is also coated with coating similar to the coating 270. In at least one embodiment where there is no or low likelihood of reaction between the material of the electrode 268 and/or tubular part 262 with the gaseous material, the coating 270 is omitted.

FIG. 2D includes schematic views of the diffuser 228 in disassembled and assembled states, in accordance with some embodiments. The electrode 268 is removably attached to the tubular part 262. Specifically, the electrode 268 has a threaded portion 281 engageable with a corresponding threaded portion 282 at a lower end of the tubular part 262. The removable attachment of the electrode 268 and the tubular part 262 facilitates maintenance and/or replacement of the electrode 268 in particular, or the diffuser 228 in general. In at least one embodiment, the electrode 268 and the tubular part 262 are rigidly attached to each other in an integral unit.

Figure 3A:
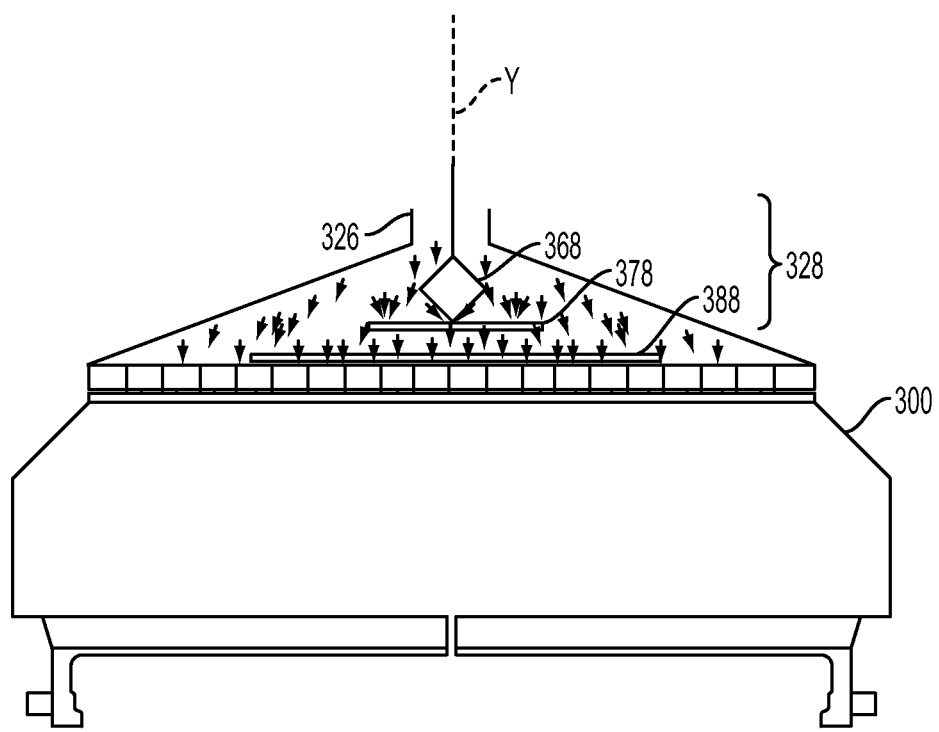
FIG. 3A is a schematic side view of a process chamber with a multi-zone diffuser, in accordance with some embodiments.

FIG. 3A is a schematic side view of a process chamber 300 with a multi-zone diffuser 328, in accordance with some embodiments. The process chamber 300 has a gas inlet 326. The multi-zone diffuser 328 includes a plurality of electrodes 368, 378, 388 arranged at various elevations in the process chamber 300. In at least one embodiment, the process chamber 300, the gas inlet 326 and the electrode 368 correspond to the process chamber 200, the gas inlet 226 and the electrode 268 described herein with respect to one or more of FIGS. 2A-2D.

The electrode 368 is a central electrode arranged on the axis Y of the gas inlet 326 of the process chamber 300. The electrodes 378, 388 are peripheral electrodes arranged between the central electrode 368 and a wafer support in the process chamber 300. In at least one embodiment, one peripheral electrode 378 or 388 is provided between the central electrode 368 and the wafer support. In one or more embodiments, more than two peripheral electrodes are provided between the central electrode 368 and the wafer support.

In at least one embodiment, one or more voltages applied to the plurality of electrodes 368, 378, 388 are controllable by a controller corresponding to the controller 280 to adjust the electric field generated by the multi-zone diffuser 328 to achieve an intended distribution of ions in the gaseous material inside the process chamber 300. For example, when the ions included in the flow of the gaseous material are positive ions, a positive voltage is applied to the central electrode 368 to generate repulsive forces pushing ions away from the axis Y at the level of the central electrode 368 adjacent the gas inlet 326. Such a repulsion is likely to reduce a concentration of ions in a central region on the axis Y behind the central electrode 368. To compensate for this decrease in ion concentration in the central region, a negative voltage is applied to the peripheral electrode 378 below the central electrode 368 to generate attractive forces pulling ions toward the axis Y. Such an attraction is likely to reduce a concentration of ions in a peripheral region of the process chamber 300. To compensate for this decrease in ion concentration in the peripheral region, a positive voltage is applied to the peripheral electrode 388 below the peripheral electrode 378 to generate repulsive force pushing ions toward the peripheral region. The above description is only an example, and other control schemes are within the scope of various embodiments. The provision of multiple electrodes at various regions inside the process chamber 300 provides a plurality of zones, in which dispersing forces acting on the ions are controllable, thereby permitting a wider and/or more uniform distribution of the gaseous material than when a single zone or electrode is used.

FIG. 3B is an enlarged schematic side view and FIG. 3C is a schematic top view of the multi-zone diffuser 300, in accordance with some embodiments. The central electrode 368 is electrically and physically coupled to the peripheral electrode 378 by one or more conductors 381, and the peripheral electrode 378 is electrically and physically coupled to the peripheral electrode 388 by one or more conductors 382. The conductors 381, 382 suspend the electrodes 378, 388 below the corresponding electrodes 368, 378. In at least one embodiment, the conductors 381, 382 are made of aluminum. In at least one embodiment, at least one of the conductors 381, 382 is insulated to supply different voltages to the corresponding electrodes 378, 388. Other arrangements for physically supporting and/or electrically coupling the plurality of electrodes 368, 378, 388 are within the scope of various embodiments.

The central electrode 368 is arranged on the axis Y of the gas inlet 326 (show in FIG. 3A), and the peripheral electrodes 378, 388 are ring-shaped electrodes arranged co-axially with the gas inlet 326 and with a chamber wall 371 of the process chamber 300. Other shapes of the peripheral electrodes 378, 388 are within the scope of various embodiments. In at least one embodiment, two or more of the plurality of electrodes 368, 378, 388 are co-elevational, i.e., arranged at the same level within the process chamber 300. For example, the peripheral electrodes 378, 388 are co-elevational and below the central electrode 368. In at least one embodiment, the central electrode 368 is omitted.

FIG. 3D is a schematic top view of a multi-zone diffuser 390, in accordance with some embodiments. The diffuser 390 includes a plurality of electrodes 393-397 arranged side-by-side as seen along the axis Y of an inlet of a process chamber via which the flow of the gaseous material is to be introduced into the process chamber. Other numbers of electrodes 393-397 are within the scope of various embodiments. Each of the electrodes 393-397 includes a central electrode 398 and a peripheral electrode 399 arranged in a configuration similar to that of the central electrode 368 and peripheral electrode 378. In at least one embodiment, the central electrode 398 or the peripheral electrode 399 is omitted from one or more of the electrodes 393-397. In at least one embodiment, one or more of the electrodes 393-397 include more than one peripheral electrodes. In at least one embodiment, two or more of the electrodes 393-397 are arranged at the same elevation within the process chamber. For example, electrodes 394-397 are co-elevational and disposed below or at the same level as the electrode 393. In at least one embodiment, the electrode 393 is omitted.

FIG. 4A is schematic side view of a process chamber 400, in accordance with some embodiments. The process chamber 400 has a gas inlet 426, a diffuser 428, and a membrane 430. The diffuser 428 includes at least one diffusing member fluidly coupled to a pressurized gas supply 429 which, in turn, is coupled to a controller 480. In at least one embodiment, the process chamber 400, the gas inlet 426, the diffuser 428, the pressurized gas supply 429 and the controller 480 correspond to the process chamber 120, the gas inlet 126, the diffuser 128, the power source 129 and the controller 180 described herein with respect to FIG. 1B. The membrane 430 corresponds to the membrane 230 described with respect to FIG. 2A. In some embodiments, the membrane 430 is omitted.

The diffuser 428, the pressurized gas supply 429 and the controller 480 together define a gas diffuser unit. The diffuser 428 includes at least one diffusing member which has a hollow body and a plurality of orifices oriented in various directions, as described herein. The pressurized gas supply 429 is fluidly coupled to the diffusing member of the diffuser 428. The controller 480 is configured to control a pressurized gas supply from the pressurized gas supply 429 to the diffusing member of the diffuser 428. Examples of the pressurized gas include, but are not limited to, inert or purge gas such as $N_2$, Ar, He and mixtures thereof. The pressurized gas supplied to the diffusing member of the diffuser 428 exits from the orifices as jets J1, J2 . . . Jk which exert dispersing forces on the gaseous material in various directions. The interaction with the jets J1, J2 . . . Jk changes the traveling paths of the gaseous material and disperses the gaseous material inside the process chamber 400. The stronger the jets J1, J2 . . . Jk, the more widely the gaseous material is dispersed inside the process chamber 400. By varying at least one of pressure, flow rate or material of the pressurized gas supplied to the diffuser 428 from the pressurized gas supply 429 under control of the controller 480, the dispersing forces generated by the jets J1, J2 . . . Jk are variable, resulting in different distributions of the gaseous material across the wafer. In at least one embodiment, a uniform distribution of the gaseous material inside the process chamber 400 is achievable under control of the controller 480, for example as described with respect to the controller 180 in FIG. 1B.

In a specific example as illustrated in FIG. 4A, when the pressurized gas of a high pressure is supplied to the diffusing member of the diffuser 428, strong jets J1, J2 . . . Jk are generated, pushing the gaseous material away from a central region 446 inside the process chamber 400, behind the diffuser 428 and in a vicinity of an axis Y of the gas inlet 426. Strong dispersing forces associated with the strong jets J1, J2 . . . Jk are likely to result in a non-uniform distribution of the gaseous material where the concentration of the gaseous material in the central region 446 is lower than in peripheral regions 448. With such a non-uniform distribution of the gaseous material, a non-uniform processing is likely to occur on the wafer being processed. By reducing the pressure and/or flow rate of the pressurized gas and/or by changing the material of the pressurized gas to include smaller or lighter molecules, the strengths of the jets J1, J2 . . . Jk are reduced, and the gaseous material are pushed with lower dispersing forces away from the central region 446. As a result, a distribution of the gaseous material in the central region 446 becomes similar to the peripheral regions 448. With such a more uniform distribution of the gaseous material, a more uniform processing is likely to occur on the wafer being processed.

FIG. 4B is an enlarged schematic view of a portion in a circle B of the diffuser 428 in FIG. 4A, in accordance with some embodiments. The diffuser 428 includes a tubular part 462 defining therein a channel 464, and a diffusing member 468 for generating dispersing forces, in the form of jets J1, J2 . . . Jk as described with respect to FIG. 4A. The tubular part 462 extends through the gas inlet 426 such that the gaseous material introduced into the process chamber 400 flows around the tubular part 462, as illustrated by arrows 442. In some embodiments, the tubular part 462 further includes one or more passages 465 branching from the channel 464 to deliver the pressurized gas to additional one or more diffusing members 468 in a multi-zone arrangement as described herein. Other arrangements for supplying pressurized gas to the diffusing member 468 without going through the gas inlet 426 are within the scope of various embodiments.

The diffusing member 468 is physically attached to a lower end of the tubular part 462 as described herein with respect to FIG. 4C, and is fluidly coupled with the channel 464 to receive the supplied pressurized gas. The diffusing member 468 defines a force generating part configured to generate dispersing forces acting in various directions on the gaseous material introduced through the gas inlet 426 into the process chamber 400. The diffusing member 468 has a hollow body having an inner space 467 in fluid communication with the channel 464, and a plurality of orifices 469 in fluid communication with the inner space 467. The plurality of orifices 469 open to the outside of the hollow body in various directions to generate jets of the pressurized gas in the various directions. In at least one embodiment, the shapes and/or sizes of at least two of the orifices 469 are different from each other, resulting in different corresponding jets of the pressurized gas and different corresponding dispersing forces. In at least one embodiment, the diffusing member 468 and/or the tubular part 462 is/are made of aluminum. In at least one embodiment, when the material of the diffusing member 468 and/or the tubular part 462 is potentially reactive with the gaseous material, a coating made of, e.g., ceramic or sapphire is applied to the outer surface of the diffusing member 468 and/or the tubular part 462. In at least one embodiment where there is no or low likelihood of reaction between the material of the diffusing member 468 and/or tubular part 462 with the gaseous material, such a coating is omitted.

FIG. 4C includes schematic views of the diffuser 428 in disassembled and assembled states, in accordance with some embodiments. The diffusing member 468 is removably attached to the tubular part 462. Specifically, the diffusing member 468 has a threaded portion 481 engageable with a corresponding threaded portion 482 at a lower end of the tubular part 462. The removable attachment of the diffusing member 468 and the tubular part 462 facilitates maintenance and/or replacement of the diffusing member 468 in particular, or the diffuser 428 in general. The removable attachment of the diffusing member 468 and the tubular part 462 also permits changing the diffusing member 468 with another diffusing member which has a different arrangement of the orifices 469, and a different corresponding arrangement of jets and associated dispersing forces, to adjust the gaseous material distribution in addition to the control by the controller 480. In at least one embodiment, the diffusing member 468 and the tubular part 462 are rigidly attached to each other in an integral unit.

FIG. 5A is a schematic side view of a process chamber 500 with a multi-zone diffuser 528, in accordance with some embodiments. The process chamber 500 has a gas inlet 526. The multi-zone diffuser 528 includes a plurality of diffusing members 568, 578 arranged at various elevations in the process chamber 500. In at least one embodiment, the process chamber 500, the gas inlet 526 and the diffusing member 568 correspond to the process chamber 400, the gas inlet 426 and the diffusing member 468 described herein with respect to one or more of FIGS. 4A-4C.

The diffusing member 568 is a central diffusing member arranged on the axis Y of the gas inlet 526 of the process chamber 500. The diffusing member 578 is peripheral diffusing member arranged between the central diffusing member 568 and a wafer support in the process chamber 500. In at least one embodiment, more than one peripheral diffusing members 578 are provided between the central diffusing member 568 and the wafer support.

In at least one embodiment, the orifices of the diffusing members 568, 578 are oriented in various directions to achieve an intended distribution of the gaseous material inside the process chamber 500. For example, the orifices of the central diffusing member 568 are oriented to generate dispersing forces pushing gaseous material away from the axis Y, at the level of the central diffusing member 568 adjacent the gas inlet 526. Such dispersing forces are likely to reduce a concentration of gaseous material in a central region on the axis Y behind the central diffusing member 568. To compensate for this decrease of the gaseous material in the central region, the orifices of the peripheral diffusing member 578 below the central diffusing member 568 are oriented to generate dispersing forces pushing gaseous material toward the axis Y, resulting in a uniform distribution of the gaseous material inside the process chamber 500. The above description is only an example, and other control schemes are within the scope of various embodiments. The provision of multiple diffusing members at various regions inside the process chamber 500 permits a wider and/or more uniform distribution of the gaseous material, as discussed with respect to FIG. 3A.

FIG. 5B is an enlarged schematic, perspective view of the peripheral diffusing member 578 in the multi-zone diffuser 528 of FIG. 5A, in accordance with some embodiments. The peripheral diffusing member 578 is a ring-shaped, hollow tube (or body) with a plurality of orifices opening in various directions. For example, some orifices of the peripheral diffusing member 578 are oriented radially inwardly, as illustrated at 577, for pushing the gaseous material toward the central region on the axis Y as discussed above with respect to FIG. 5A. Some other orifices of the peripheral diffusing member 578 are oriented radially outwardly, as illustrated at 579, for pushing the gaseous material toward the peripheral regions to achieve a wide and uniform distribution of the gaseous material.

FIG. 5B is an enlarged schematic side view and FIG. 5C is a schematic top view of the multi-zone diffuser 500, in accordance with some embodiments. The central diffusing member 568 is fluidly and physically coupled to the peripheral diffusing member 578 by one or more pipes 581, and the peripheral diffusing member 578 is fluidly and physically coupled to a further peripheral diffusing member 588 by one or more pipes 582. The pipes 581, 582 suspend the diffusing members 578, 588 below the corresponding diffusing members 568, 578. In at least one embodiment, the pipes 581, 582 are made of aluminum. Other arrangements for physically supporting and/or fluidly coupling the plurality of diffusing members 568, 578, 588 are within the scope of various embodiments.

The central diffusing member 568 is arranged on the axis Y of the gas inlet 526 (show in FIG. 5A), and the peripheral diffusing members 578, 588 are ring-shaped diffusing members arranged co-axially with the gas inlet 526. Other shapes of the peripheral diffusing members 578, 588 are within the scope of various embodiments. In at least one embodiment, two or more of the plurality of diffusing members 568, 578, 588 are co-elevational, i.e., arranged at the same level within the process chamber 500. For example, the peripheral diffusing members 578, 588 are co-elevational and below the central diffusing member 568. In at least one embodiment, the central diffusing member 568 is omitted.

FIG. 5E is a schematic top view of a multi-zone diffuser 590, in accordance with some embodiments. The diffuser 590 includes a plurality of diffusing members 593-397 arranged side-by-side as seen along the axis Y of an inlet of a process chamber via which the flow of the gaseous material is to be introduced into the process chamber. Other numbers of diffusing members 593-397 are within the scope of various embodiments. Each of the diffusing members 593-397 includes a central diffusing member 598 and a peripheral diffusing member 599 arranged in a configuration similar to that of the central diffusing member 568 and peripheral diffusing member 578. In at least one embodiment, the central diffusing member 598 or the peripheral diffusing member 599 is omitted from one or more of the diffusing members 593-397. In at least one embodiment, one or more of the diffusing members 593-397 include more than one peripheral diffusing members. In at least one embodiment, two or more of the diffusing members 593-397 are arranged at the same elevation within a chamber wall 571 of the process chamber. For example, diffusing members 594-397 are co-elevational and disposed below or at the same level as the diffusing member 593. In at least one embodiment, the diffusing member 593 is omitted.

Compared to embodiments described with respect to FIGS. 2A-3D, which are configured to disperse gaseous material including ions, embodiments described with respect to FIGS. 4A-5E are usable to disperse any gaseous material, regardless of whether the gaseous material includes ions or not. In some embodiments, one or more of the diffusing members using pressurized gas, as described with respect to FIGS. 4A-5E, is/are also configured as one or more electrodes, as described with respect to FIGS. 2A-3D. In such embodiments, one or more described control schemes using electric power is/are applicable together with one or more described control schemes using pressurized gas, to further enhance uniformity of the gaseous material distribution inside the process chamber.

Figure 6:
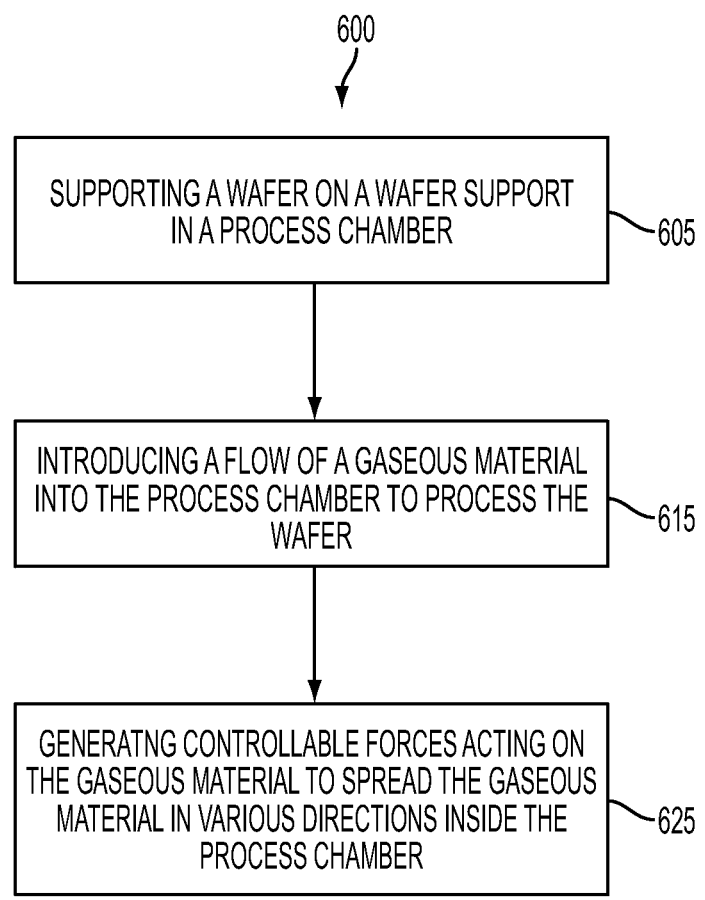
FIG. 6 is a flow chart of a method of wafer processing, in accordance with some embodiments.

FIG. 6 is a flow chart of a method 600 of wafer processing, in accordance with some embodiments.

At operation 605, a wafer is supported on a wafer support in a process chamber. For example, a wafer 160 is supported on a wafer support 123 in a process chamber 120 as described with respect to FIG. 1B.

At operation 615, a flow of a gaseous material is introduced into the process chamber to process the wafer. For example, a flow of a gaseous material is introduced via a gas inlet 126 into the process chamber 120 to process the wafer 160, e.g., to deposit a film or etch a film on the wafer 160, as described with respect to FIG. 1B.

At operation 625, controllable forces are generated to act on the gaseous material to spread the gaseous material in various directions inside the process chamber. For example, a diffuser 128 is used to generate controllable forces F1, F2 . . . Fn which act on the gaseous material and spread the gaseous material in various directions inside the process chamber 120, as described with respect to FIG. 1B. In some embodiments, the forces are electrostatic forces acting on ions included in the gaseous material, and are controlled by varying current, voltage and/or polarity of a power supply, as described with respect to one or more of FIGS. 2A-3D. In some embodiments, the forces are defined by jets of a pressurized gas acting on ions, atoms and/or molecules included in the gaseous material, and are controlled by varying flow rate, pressure and/or material of the pressurized gas, as described with respect to one or more of FIGS. 4A-5E.

Operations may be added, replaced, changed order, and/or eliminated as appropriate, in accordance with the spirit and scope of embodiments of the disclosure. Embodiments that combine different features and/or different embodiments are within scope of the disclosure and will be apparent to those skilled in the art after reviewing this disclosure.

Figure 7:
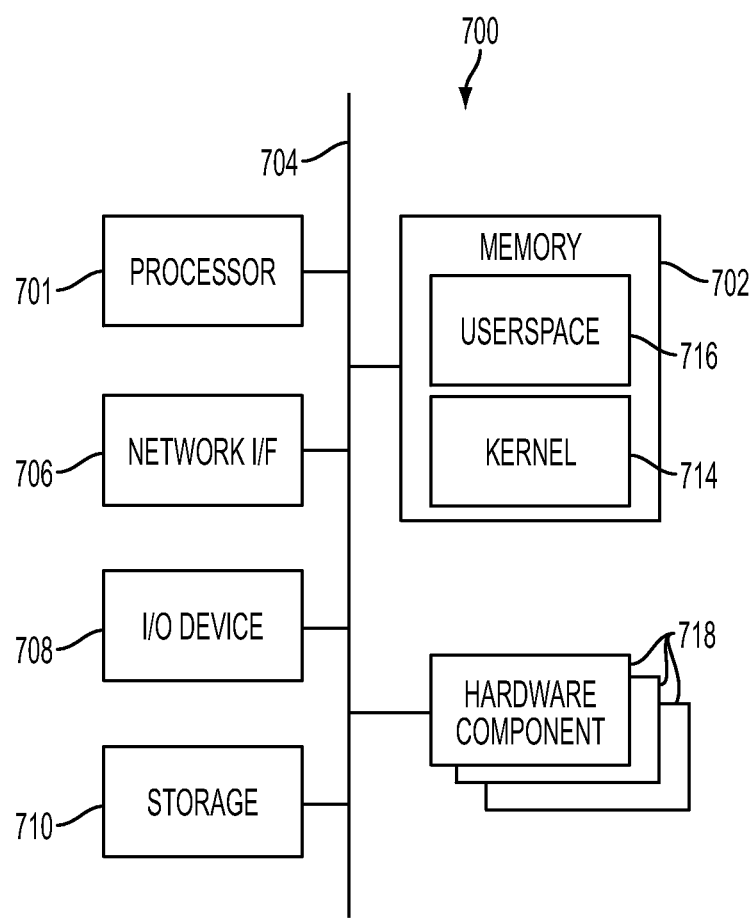
FIG. 7 is a block diagram of a computer system, in accordance with some embodiments.

One or more of the controllers 114, 180 is realized in some embodiments as a computer system 700 of FIG. 7. The system 700 comprises a processor 701, a memory 702, a network interface (I/F) 706, a storage 310, an input/output (I/O) device 708, and one or more hardware components 718 communicatively coupled via a bus 704 or other interconnection communication mechanism.

The memory 702 comprises, in some embodiments, a random access memory (RAM) and/or other dynamic storage device and/or read only memory (ROM) and/or other static storage device, coupled to the bus 704 for storing data and/or instructions to be executed by the processor 701, e.g., kernel 714, userspace 716, portions of the kernel and/or the userspace, and components thereof. The memory 702 is also used, in some embodiments, for storing temporary variables or other intermediate information during execution of instructions to be executed by the processor 701.

In some embodiments, a storage device 710, such as a magnetic disk or optical disk, is coupled to the bus 704 for storing data and/or instructions, e.g., kernel 714, userspace 716, etc. The I/O device 708 comprises an input device, an output device and/or a combined input/output device for enabling user interaction with the system 700. An input device comprises, for example, a keyboard, keypad, mouse, trackball, trackpad, and/or cursor direction keys for communicating information and commands to the processor 701. An output device comprises, for example, a display, a printer, a voice synthesizer, etc. for communicating information to a user.

In some embodiments, the processes or functionality described with respect to one or more of the controllers 114, 180 are realized by a processor, e.g., the processor 701, which is programmed for performing such processes. One or more of the memory 702, the I/F 706, the storage 310, the I/O device 708, the hardware components 718, and the bus 704 is/are operable to receive instructions, data, design rules and/or other parameters for processing by the processor 701.

In some embodiments, one or more of the processes or functionality is/are performed by specifically configured hardware (e.g., by one or more application specific integrated circuits or ASIC(s)) which is/are included) separate from or in lieu of the processor. Some embodiments incorporate more than one of the described processes in a single ASIC.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

According to some embodiments, a gas diffuser unit for a process chamber comprises at least one controllable diffuser, a power source, and a controller. The at least one controllable diffuser is configured to generate controllable forces acting in various directions on a gaseous material in a flow of the gaseous material introduced into the process chamber, to spread the gaseous material inside the process chamber. The power source is coupled to the at least one controllable diffuser, and configured to supply power to the at least one controllable diffuser to generate the controllable forces. The controller is coupled to the power source and configured to control the power supplied by the power source to the at least one controllable diffuser.

According to some embodiments, a process chamber has an inlet configured to receive a flow of a gaseous material, a wafer support in the process chamber and configured to support thereon a wafer, and at least one controllable diffuser disposed in the process chamber between the inlet and the wafer support. The at least one controllable diffuser is configured to generate controllable forces acting in various directions on the gaseous material introduced into the process chamber, to spread the gaseous material inside the process chamber.

According to some embodiments, a method of wafer processing comprises: supporting a wafer in a process chamber, introducing a flow of a gaseous material through an inlet of the process chamber to process the wafer, and generating, between the inlet and the wafer, controllable forces acting in various directions on the gaseous material to spread the gaseous material inside the process chamber.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A process chamber, comprising:
   an inlet configured to receive a flow of a gaseous material;
   a wafer support in the process chamber, the wafer support configured to support thereon a wafer and to heat and rotate the wafer during wafer processing; and
   at least one controllable diffuser disposed in the process chamber between the inlet and the wafer support, the at least one controllable diffuser configured to generate controllable forces acting in various directions on the gaseous material introduced into the process chamber to spread the gaseous material inside the process chamber.

2. The process chamber of claim 1, wherein the at least one controllable diffuser comprises at least one electrode configured to receive electric power to generate an electric field acting on ions included in the gaseous material.

3. The process chamber of claim 2, further comprising:
   a tubular part extending through the inlet of the process chamber,
   a conductor received in the tubular part, the conductor having opposite first and second ends, the first end configured to be coupled to an electric power supply, the second end electrically coupled to the at least one electrode, and
   an insulating material between the tubular part and the conductor.

4. The process chamber of claim 3, wherein the tubular part is electrically conductive and is grounded.

5. The process chamber of claim 3, wherein the at least one electrode comprises
   a central electrode arranged on an axis of the inlet of the process chamber, and
   at least one ring electrode co-axial with the inlet of the process chamber, the at least one ring electrode arranged between the central electrode and the wafer support.

6. The process chamber of claim 2, wherein the at least one electrode comprises a plurality of electrodes arranged side-by-side as seen along an axis of the inlet of the process chamber.

7. The process chamber of claim 1, wherein the at least one controllable diffuser comprises at least one hollow body having an inner space and a plurality of orifices communicated with the inner space,
   the plurality of orifices opening in the various directions,
   the inner space configured to receive a pressurized gas and to cause the pressurized gas to exit from the orifices and spread the gaseous material inside the process chamber.

8. The process chamber of claim 7, further comprising:
   a tubular part extending through the inlet of the process chamber, the tubular part having opposite first and second ends, the first end configured to be coupled to a source of the pressurized gas, the second end fluidly coupled to the at least one hollow body.

9. The process chamber of claim 7, wherein the at least one hollow body comprises
   a central hollow body arranged on an axis of the inlet of the process chamber, and
   at least one annular hollow body co-axial with the inlet of the process chamber, the at least one annular hollow body arranged between the central hollow body and the wafer support.

10. The process chamber of claim 7, wherein the at least one hollow body comprises a plurality of hollow bodies arranged side-by-side as seen along an axis of the inlet of the process chamber.

11. A wafer process chamber, comprising:
    an inlet configured to receive a flow of a gaseous material;
    a wafer support in the process chamber, the wafer support configured to support thereon a wafer, and to heat and rotate the wafer during wafer processing; and
    a plurality of controllable diffusers in the process chamber between the inlet and the wafer support,
    wherein the plurality of controllable diffusers comprises at least one of
      a plurality of electrodes configured to generate electric fields for acting on ions included in the gaseous material to spread the gaseous material inside the process chamber, or
      a plurality of hollow bodies each having
        an inner space configured to receive a pressurized gas, and
        a plurality of orifices communicated with the inner space, the plurality of orifices opening in various directions and configured to cause the pressurized gas exiting from the orifices to spread the gaseous material inside the process chamber.

12. The wafer process chamber of claim 11, wherein the plurality of controllable diffusers is arranged in at least one of a first arrangement in which the plurality of controllable diffusers is arranged co-axially with the inlet of the process chamber, or a second arrangement in which the plurality of controllable diffusers is arranged side-by-side as seen along an axis of the inlet of the process chamber.

\* \* \* \* \*